US012560687B2

(12) United States Patent
Taddiken et al.

(10) Patent No.: US 12,560,687 B2
(45) Date of Patent: Feb. 24, 2026

(54) TIME-OF-FLIGHT SENSOR AND METHOD FOR FABRICATING A TIME-OF-FLIGHT SENSOR

(71) Applicant: Infineon Technologies AG, Neubiberg (DE)

(72) Inventors: Hans Taddiken, Munich (DE); Dirk Offenberg, Dresden (DE); Trinath Reddy Pinnapa, Dresden (DE); Steffen Rothenhäußer, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 436 days.

(21) Appl. No.: 18/298,836

(22) Filed: Apr. 11, 2023

(65) Prior Publication Data

US 2023/0350032 A1        Nov. 2, 2023

(30) Foreign Application Priority Data

Apr. 27, 2022    (EP) ..................................... 22170292

(51) Int. Cl.
| | |
|---|---|
| *H10F 71/00* | (2025.01) |
| *G01S 7/481* | (2006.01) |
| *G01S 7/4914* | (2020.01) |
| *H10F 30/222* | (2025.01) |
| *H10F 77/14* | (2025.01) |

(52) U.S. Cl.
CPC .......... *G01S 7/4914* (2013.01); *G01S 7/4816* (2013.01); *H10F 30/222* (2025.01); *H10F 71/1215* (2025.01); *H10F 77/147* (2025.01)

(58) Field of Classification Search
CPC .... G01S 7/4914; G01S 7/4816; H10F 77/147; H10F 71/1215; H10F 30/222
See application file for complete search history.

(56) References Cited

U.S. PATENT DOCUMENTS

| | | |
|---|---|---|
| 2018/0188356 A1 | 7/2018 | Na et al. |
| 2021/0066529 A1 | 3/2021 | Lu et al. |
| 2021/0210543 A1 | 7/2021 | Hseih et al. |
| 2024/0154053 A1* | 5/2024 | Masini ................. H10F 30/222 |

FOREIGN PATENT DOCUMENTS

EP        3029728 A1    6/2016

OTHER PUBLICATIONS

Sahni et al., "The Dual-Heterojunction Ge on Si Photodetector," ECS Transactions, The Electrochemical Society, 2014, pp. 783-789.

* cited by examiner

*Primary Examiner* — Suberr L Chi
(74) *Attorney, Agent, or Firm* — Harrity & Harrity, LLP

(57) ABSTRACT

A time-of-flight sensor includes at least one pixel, including: a Si-based photocurrent collecting structure and a Ge-based photosensitive structure epitaxially grown on the photocurrent collecting structure, wherein the photocurrent collecting structure includes an n-doped region and a p-doped region, wherein the n-doped region is configured to conduct electrons of a photocurrent to at least one n-contact and wherein the p-doped region is configured to conduct holes of the photocurrent to at least one p-contact and wherein the conduction band in the p-doped region includes a barrier for the electrons of the photocurrent and the valence band in the n-doped region includes a barrier for the holes of the photocurrent.

13 Claims, 4 Drawing Sheets

400

110

111     112

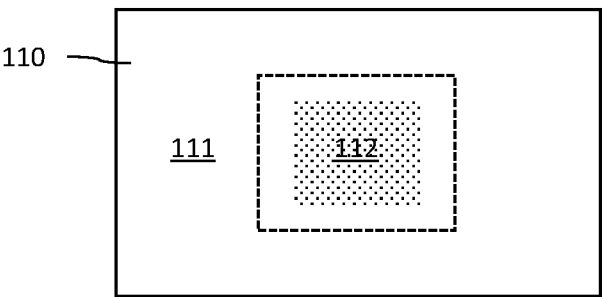

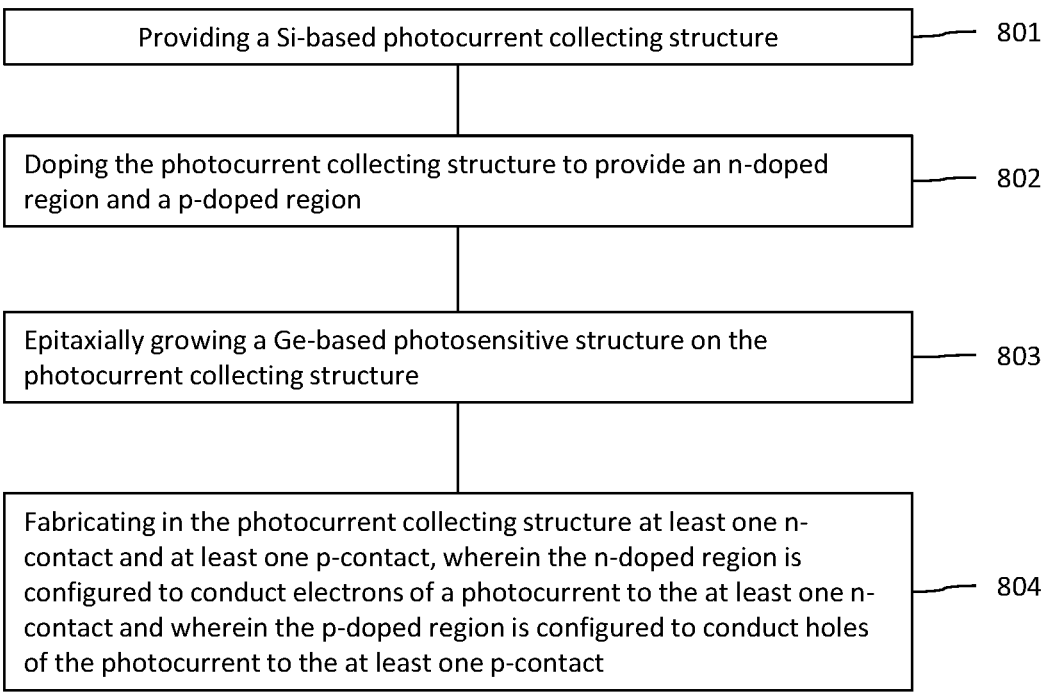

Providing a Si-based photocurrent collecting structure — 801

Doping the photocurrent collecting structure to provide an n-doped region and a p-doped region — 802

Epitaxially growing a Ge-based photosensitive structure on the photocurrent collecting structure — 803

Fabricating in the photocurrent collecting structure at least one n-contact and at least one p-contact, wherein the n-doped region is configured to conduct electrons of a photocurrent to the at least one n-contact and wherein the p-doped region is configured to conduct holes of the photocurrent to the at least one p-contact — 804

Fig. 8

TIME-OF-FLIGHT SENSOR AND METHOD FOR FABRICATING A TIME-OF-FLIGHT SENSOR

CROSS REFERENCE TO RELATED APPLICATION

This application claims priority to European Patent Application No. 22170292 filed on Apr. 27, 2022, the content of which is incorporated by reference herein in its entirety.

TECHNICAL FIELD

This disclosure relates in general to a time-of-flight sensor as well as to a method for fabricating a time-of-flight sensor.

BACKGROUND

Indirect time-of-flight (iTOF) sensors may use infrared light, for example infrared light with a wavelength of about 900 nm. At such wavelengths however, Si is a comparably poor choice as detector material because it has a low light absorption coefficient there. Sensor pixels, wherein a Ge-based photosensitive structure is epitaxially grown on a Si-based photocurrent collecting structure may be used to address this shortcoming. Sensor pixels comprising Ge are also sensitive to even longer wavelengths than 900 nm, which allows for the use of light sources with higher power levels without a risk of damaging the human eye. However, Ge-comprising sensor devices may exhibit a larger dark current than devices that only comprise Si. This may be caused by the smaller bandgap and relatively high density of states in Ge. Improved time-of-flight sensors as well as improved methods for fabricating time-of-flight sensors may help in solving these and other problems.

The problem on which the implementation is based is solved by the features of the independent claims. Further advantageous examples are described in the dependent claims.

SUMMARY

Various aspects pertain to a time-of-flight sensor, including: at least one pixel, including: a Si-based photocurrent collecting structure, a Ge-based photosensitive structure epitaxially grown on the photocurrent collecting structure, wherein the photocurrent collecting structure includes an n-doped region and a p-doped region, wherein the n-doped region is configured to conduct electrons of a photocurrent to at least one n-contact and wherein the p-doped region is configured to conduct holes of the photocurrent to at least one p-contact, and wherein the conduction band in the p-doped region includes a barrier for the electrons of the photocurrent and the valence band in the n-doped region includes a barrier for the holes of the photocurrent.

Various aspects pertain to a method for fabricating a time-of-flight sensor, the method including: providing a Si-based photocurrent collecting structure, doping the photocurrent collecting structure to provide an n-doped region and a p-doped region, epitaxially growing a Ge-based photosensitive structure on the photocurrent collecting structure, and fabricating in the photocurrent collecting structure at least one n-contact and at least one p-contact, wherein the n-doped region is configured to conduct electrons of a photocurrent to the at least one n-contact and wherein the p-doped region is configured to conduct holes of the photocurrent to the at least one p-contact, and wherein the conduction band in the p-doped region includes a barrier for the electrons of the photocurrent and the valence band in the n-doped region includes a barrier for the holes of the photocurrent.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

FIG. 7 shows a plan view onto the photocurrent collecting structure of the pixel of FIG. 6.

FIG. 8 is a flow chart of an example method for fabricating a time-of-flight sensor.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise".

The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "example" is merely meant as an example, rather than the best or optimal.

In several examples, layers or layer stacks are applied to one another or materials are applied or deposited onto layers. It should be appreciated that any such terms as "applied" or "deposited" are meant to cover literally all kinds and techniques of applying materials onto each other. In particular, they are meant to cover techniques in which layers are applied at once as a whole as well as techniques in which layers are deposited in a sequential manner.

An efficient time-of-flight sensor as well as an efficient method for fabricating a time-of-flight sensor may for example reduce material consumption, ohmic losses, chemical waste, etc. and may thus enable energy and/or resource savings. Improved time-of-flight sensors as well as improved methods for fabricating a time-of-flight sensor, as specified in this description, may thus at least indirectly contribute to green technology solutions, e.g., climate-friendly solutions providing a mitigation of energy and/or resource use.

Figure 1:
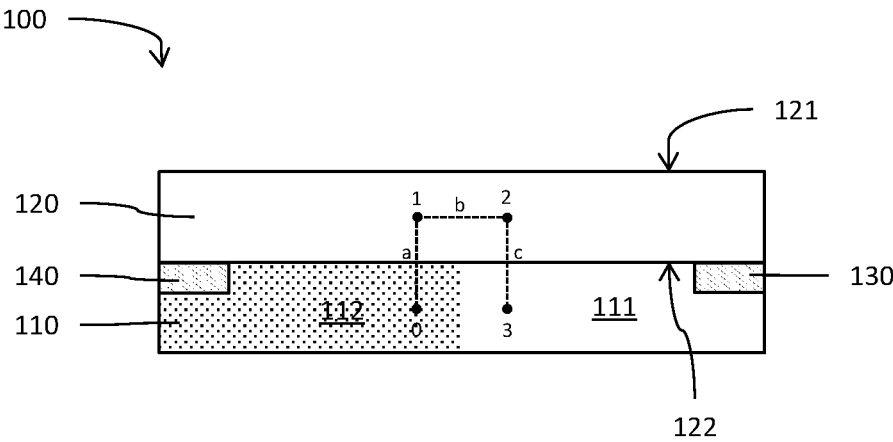
FIG. 1 shows a sectional view of a pixel of a time-of-flight sensor, wherein the pixel comprises a Ge-based photosensitive structure and a Si-based photocurrent collecting structure.

FIG. 1 shows a sectional view of a pixel 100 of a time-of-flight sensor. The pixel 100 comprises a Si-based photocurrent collecting structure 110 and a Ge-based photosensitive structure 120. The photosensitive structure 120 is epitaxially grown on the photocurrent collecting structure 110.

The photosensitive structure 120 may be configured to absorb photons and convert the photons into electrons and holes via the inner photoelectric effect. The generated electrons and/or holes may constitute a photocurrent in the pixel 100. The pixel 100 may for example be configured to be sensitive to infrared light. The pixel 100 may in particular be sensitive to infrared light with a wavelength of about 900 nm or more than 900 nm.

The time-of-flight sensor may comprise a single pixel 100 or it may comprise a plurality of pixels 100 which may e.g., be arranged in an array. The time-of-flight sensor may further comprise suitable evaluation circuitry for evaluating a signal detected by the at least one pixel 100. The time-of-flight sensor may in particular be an indirect time-of-flight sensor (iTOF sensor), wherein modulated light is emitted and the modulation shift in the returned light may be measured to calculate a distance.

The photocurrent collecting structure 110 comprises an n-doped region 111 and a p-doped region 112. The n-doped region 111 is configured to conduct electrons of a photocurrent to at least one n-contact 130 and the p-doped region 112 is configured to conduct holes of the photocurrent to at least one p-contact 140. Furthermore, the conduction band in the p-doped region comprises a barrier for the electrons of the photocurrent and the valence band in the n-doped region comprises a barrier for the holes of the photocurrent (this is explained in greater detail with respect to FIG. 2). The n-contact and the p-contact may be coupled to read-out circuitry of the time-of-flight sensor.

The at least one n-contact 130 may be arranged at the n-doped region 111 and the p-contact 140 may be arranged at the p-doped region 112. According to an example, the pixel 100 comprises at least two n-contacts 140 and at least one p-contact 140 or at least one n-contact 140 and at least two p-contacts 140 in order to demodulate the incoming signal.

The photosensitive structure 120 may have a first side 121 and an opposite second side 122, wherein the second side 122 may be arranged over the photocurrent collecting structure 110. According to an example, the pixel 100 is configured for front side illumination, wherein photons that are to be detected by the pixel 100 are directed towards the photosensitive structure 120 from above the first side 121. According to another example, the pixel 100 is configured for backside illumination, wherein the photons are directed towards the photosensitive structure 120 from below the second side 122 (and pass through the photocurrent collecting structure 110).

The pixel 100 may be configured as a uni-traveling carrier (UTC) device. This may mean that the energy bands of the photosensitive structure 120, the n-doped region 111 and the p-doped region 112 are configured such that a barrier prevents electrons of the photocurrent from reaching the p-contact 140 and another barrier prevents holes of the photocurrent from reaching the n-contact 130. At the same time, no such barrier prevents the electrons from reaching the n-contact 130, respectively the holes from reaching the p-contact 140. An example band structure of such a UTC is described further below with respect to FIG. 2.

Any suitable dopants may be used to fabricate the n-doped region 111, the p-doped region 112 and the photosensitive structure 120. The p-doped region 112 of the photocurrent collecting structure 110 may for example have a doping concentration in the range of $1 \times 10^{14}$ cm$^{-3}$ to $1 \times 10^{19}$ cm$^{-3}$. The n-doped region 111 may for example have a doping concentration in the range of $1 \times 10^{12}$ cm$^{-3}$ to $5 \times 10^{19}$ cm$^{-3}$. The photosensitive structure 120 may be p-doped or the photosensitive structure 120 may be n-doped or the photosensitive structure may comprise a p-n junction. The photosensitive structure 120 may for example have a doping concentration in the range of $1 \times 10^{14}$ cm$^{-3}$ to $1 \times 10^{19}$ cm$^{-3}$.

According to an example, the pixel 100 comprises a transitional region between the photosensitive structure 120 and the photocurrent collecting structure 110 (not shown in FIG. 1). In this transitional region, a concentration of Ge gradually decreases and a concentration of Si gradually increases in a direction from the photosensitive structure 120 towards the photocurrent collecting structure 110.

Figure 2:
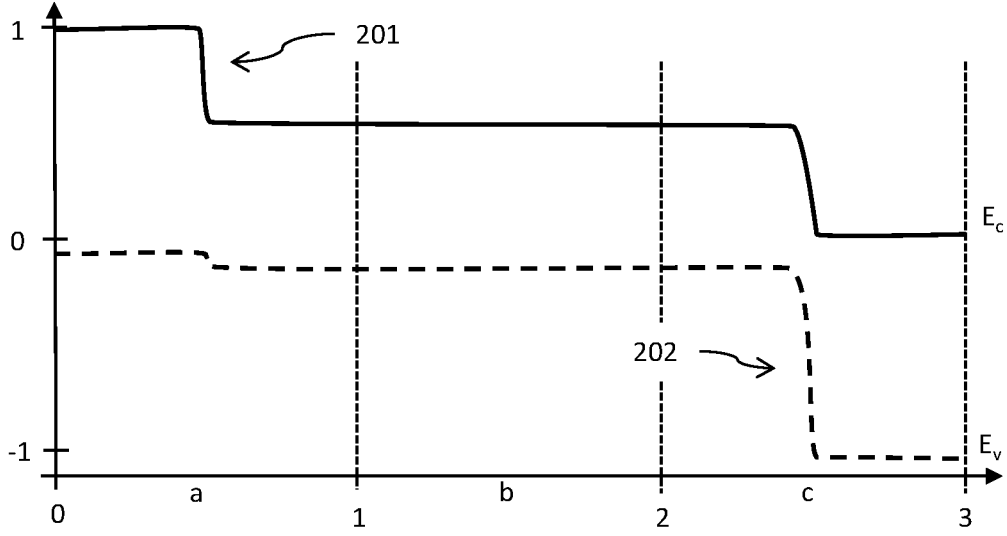
FIG. 2 is a band diagram along the lines a-b-c in FIG. 1, according to a specific example of a pixel for a time-of-flight sensor.

FIG. 2 is a band diagram showing the conduction band $E_c$ and the valence band $E_v$ along the lines a-b-c in FIG. 1, according to a specific example of the pixel 100. The line a extends from point 0 in the p-doped region 112 to point 1 in the photosensitive structure 120, the line b extends from point 1 to point 2 in the photosensitive structure 120 and line c extends from point 2 to point 3 in the n-doped region 110 of the photocurrent collecting structure 110.

In the example shown in FIG. 2, the pixel 100 is configured as a UTC device. The p-doped region 112 comprises a barrier at 201 which prevents the electrons of the photocurrent from traversing deeper into the p-doped region 112. Conversely, the n-doped region 111 comprises another barrier at 202 which prevents the holes of the photocurrent from traversing deeper into the n-doped region 111. Therefore, the electrons can only move towards the n-contact 130 and the holes can only move towards the p-contact 140.

According to an example, the photosensitive structure 120 of the example of FIG. 2 is p-doped and according to another example, the photosensitive structure 120 is n-doped.

Table 1 below shows specific examples of doping concentrations which may be used in the p-doped region 112, the photosensitive structure 120 and the n-doped region 111. As mentioned further above, other doping concentrations can be used as well. Table 1 only demonstrates specific examples of combinations of doping concentrations which result in a UTC device.

TABLE 1

| Example | p-doped region | Photosensitive structure | n-doped region |
|---|---|---|---|
| 1 | $1 \times 10^{18}$ cm$^{-3}$ | $2 \times 10^{17}$ cm$^{-3}$ | $3 \times 10^{18}$ cm$^{-3}$ |
| 2 | $1 \times 10^{16}$ cm$^{-3}$ | $4 \times 10^{17}$ cm$^{-3}$ | $1 \times 10^{19}$ cm$^{-3}$ |
| 3 | $5 \times 10^{18}$ cm$^{-3}$ | $1 \times 10^{17}$ cm$^{-3}$ | $6 \times 10^{18}$ cm$^{-3}$ |

In the examples 1 and 2 of Table 1, the photosensitive structure 120 is n-doped. In the example 3 on the other hand, the photosensitive structure 120 is p-doped.

In example 2, the p-doped region 112 may comprise a barrier for the holes which can only be traversed by tunneling. For this reason, example 2 may be less preferred than examples 1 or 3.

Figures 3, 4:
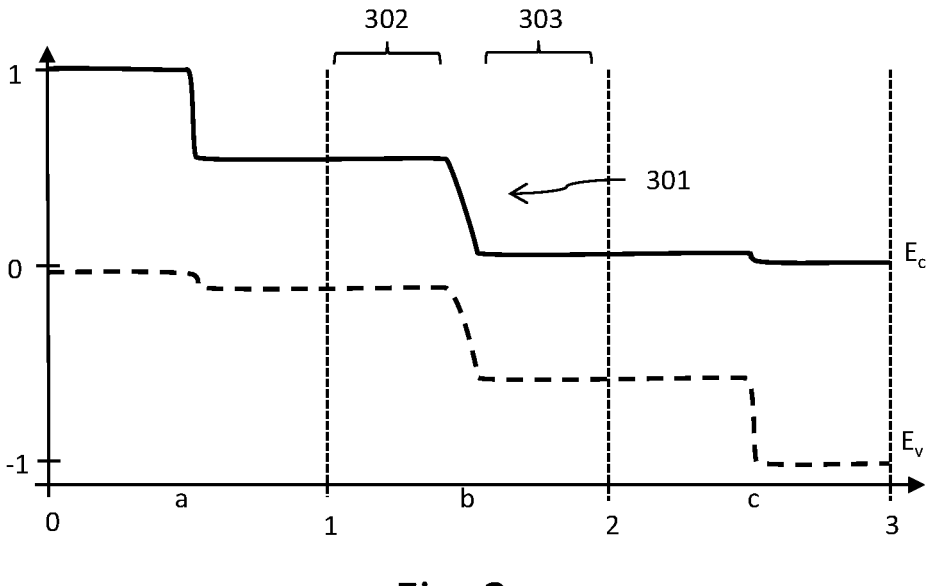
FIG. 3 is a further band diagram along the lines a-b-c in FIG. 1, wherein the photosensitive structure comprises a doping gradient.
FIG. 4 shows a sectional view of a further pixel for a time-of-flight sensor, wherein the pixel comprises a charge sheet arranged between the n-doped region of the photocurrent collecting structure and the photosensitive structure.

FIG. 3 is a further band diagram showing the conduction band $E_c$ and the valence band $E_v$ along the lines a-b-c in FIG. 1, according to a further specific example of the pixel 100.

In the example shown in FIG. 3, the photosensitive structure 120 comprises a doping gradient or a p-n junction at 301. Such a doping gradient or p-n junction may help with separating the charge carriers of the photocurrent.

The doping gradient may for example have a start value at the interface between the photocurrent collecting structure 110 and the photosensitive structure 120 in the range of $3 \times 10^{13}$ cm$^{-3}$ and $3 \times 10^{17}$ cm$^{-3}$ and an end value in the range of $5 \times 10^{17}$ cm$^{-3}$ and $1 \times 10^{20}$ cm$^{-3}$.

Table 2 below shows specific examples of doping concentrations which may be used to provide a pixel 100 with a band diagram as shown in FIG. 3. In Table 2, the photosensitive structure 120 is split into a first photosensitive region 302 and a second photosensitive region 303.

TABLE 2

| Ex. | p-doped region | Photosensitive structure | | n-doped region |
|---|---|---|---|---|
| | | $1^{st}$ region 302 | $2^{nd}$ region 303 | |
| 4 | $5 \times 10^{18}$ cm$^{-3}$ | $1 \times 10^{17}$ cm$^{-3}$ | $5 \times 10^{17}$ cm$^{-3}$ | $6 \times 10^{18}$ cm$^{-3}$ |
| 5 | $3 \times 10^{18}$ cm$^{-3}$ | $5 \times 10^{16}$ cm$^{-3}$ | $4 \times 10^{17}$ cm$^{-3}$ | $7 \times 10^{18}$ cm$^{-3}$ |
| 6 | $6 \times 10^{18}$ cm$^{-3}$ | $7 \times 10^{17}$ cm$^{-3}$ | $2 \times 10^{16}$ cm$^{-3}$ | $8 \times 10^{18}$ cm$^{-3}$ |

In example 4 of Table 2, the photosensitive structure 120 comprises a p-n junction, wherein the first region 302 is p-doped and the second region 303 is n-doped. In example 5, both the first and second regions 302, 303 of the photosensitive structure are n-doped and in example 6 both the first and second regions 302, 303 are p-doped.

FIG. 4 shows a sectional view of a further pixel 400 which may be similar or identical to the pixel 100, except for the differences described in the following.

In particular, the pixel 400 may comprise all parts described with respect to the pixel 100 and it may additionally comprise a charge sheet 410. The charge sheet 410 may be arranged between the n-doped region 111 and the photosensitive structure 120. The charge sheet 410 may be configured to reduce an electric field strength at least in a part of the photosensitive structure 120. This in turn may result in a reduced dark current in the pixel 100 (especially in the case that the dark current is defined by trap-assisted tunneling from dislocations in the Ge). The charge sheet 410 may also be configured to support separation of the charge carrier (e.g., the electrons and holes) of the photocurrent towards the n-contact 130 and p-contact 140, respectively.

The charge sheet 410 may comprise or consist of p-doped Si. A doping concentration of the charge sheet 410 may be different from the doping concentration of the p-doped region 112. The charge sheet 410 may for example have a doping concentration in the range of $8 \times 10^{15}$ cm$^{-3}$ to $2 \times 10^{16}$ cm$^{-3}$. The doping concentration may for example be about $1 \times 10^{16}$ cm$^{-3}$.

The charge sheet 410 may be thin (wherein thickness is measured perpendicular to the first and second sides 121, 122 of the photosensitive structure, compare FIG. 1). In particular, the charge sheet 410 may be thinner than the photosensitive structure 120 and/or thinner than the photocurrent collecting structure 110. A thickness of the charge sheet 410 may for example be no more than 40% or no more than 30% or no more than 10% or no more than 5% of a thickness of the photosensitive structure 120 and/or a thickness of the photocurrent collecting structure 110.

In the example shown in FIG. 4, the charge sheet 410 is only arranged between the n-doped region 111 and the photosensitive structure 120. However, it is also possible that the charge sheet 410 is furthermore arranged between the p-doped region 112 and the photosensitive structure 120 (that is, neither the n-doped region 111 nor the p-doped region 112 are in direct contact with the photosensitive structure 120). Such an arrangement may result in a (small) barrier for the holes of the photocurrent in the p-doped region 112 (wherein the holes have to tunnel through that barrier). However, in such an arrangement the Si—Ge interface is defined by a single doping type which may provide improved results in the epitaxial growth of the Ge-based photosensitive structure 120 on the photocurrent collecting structure 110.

Figure 5:
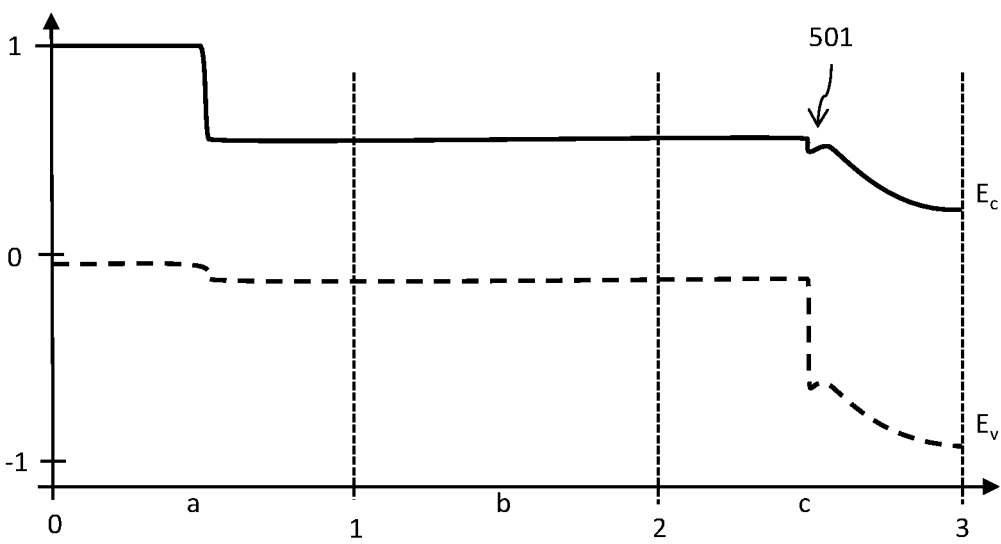
FIG. 5 is a band diagram along the lines a-b-c in FIG. 4, according to a specific example of the pixel.

FIG. 5 is a further band diagram showing the conduction band $E_c$ and the valence band $E_v$ along the lines a-b-c in FIG. 4, according to a specific example of the pixel 400.

At 501 in FIG. 5, the charge sheet 410 prevents or at least reduces a penetration of the electric field from the p-n junction into the photosensitive structure 120. As noted above, this may reduce a dark current in the pixel 400.

According to an example, the photosensitive structure 120 of the pixel 400 also comprises the doping gradient or p-n junction described further above with respect to FIG. 3.

Figure 6:
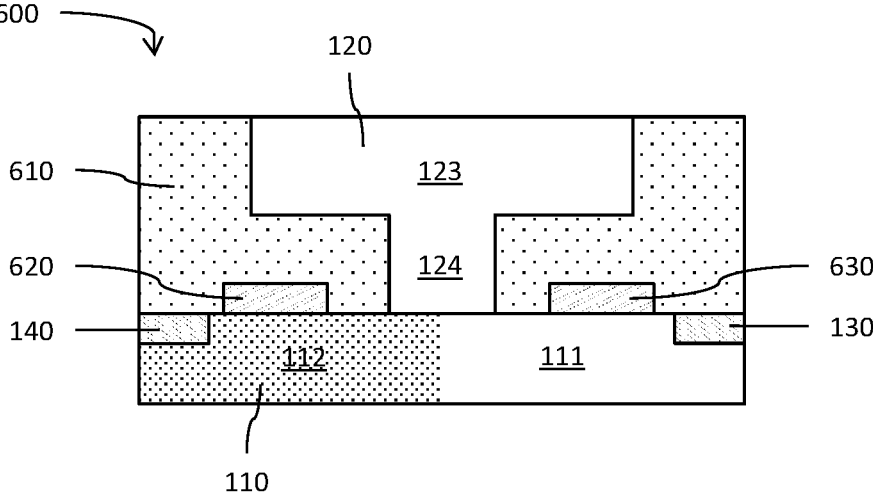
FIG. 6 shows a sectional view of a further pixel for a time-of-flight sensor, wherein the photosensitive structure comprises a trunk portion and an upper portion.

FIG. 6 shows a sectional view of a further pixel 600 which may be similar or identical to the pixel 100 or 400, except for the differences described in the following.

In particular, the photosensitive structure 120 of the pixel 600 comprises an upper portion 123 and a trunk portion 124. The upper portion 123 and the trunk portion 124 are integral with each other. In other words, the upper portion 123 and the trunk portion 124 are regions of a single contiguous photosensitive structure 120. The trunk portion 124 is arranged on the photocurrent collecting structure 110 and the upper portion 123 is arranged on the trunk portion 124. A cross section of the photosensitive structure 120 may essentially have a T-shape, as shown in FIG. 6.

The trunk portion 124 may for example have an aspect ratio in the range of 1:1 to 1:10, e.g., an aspect ratio of about 1:2, 1:4, 1:6, or 1:8. The trunk portion 124 may be used for aspect ratio trapping (ART) to prevent dislocations in the lattice from propagating to the upper portion 123 during epitaxial growth of the photosensitive structure 120.

The pixel 600 may comprise a dielectric material layer 610, wherein the photosensitive structure (or at least the trunk portion 124 of the photosensitive structure 120) is at least partially covered by the dielectric material layer 610. In particular, the dielectric material layer 610 may comprise a layer stack comprising a lower dielectric material layer and an upper dielectric material layer. The trunk portion 124 may be arranged in an aperture of the lower dielectric material layer and the upper portion 123 may be arranged on top of the trunk portion 124 and the lower dielectric material layer. The dielectric material layer 610 may comprise or consist of any suitable dielectric material, for example an oxide like silicon oxide.

The pixel 600 may also comprise demodulation gates 620, 630 configured to direct electrons of the photocurrent to a particular n-contact 130 of a plurality of n-contacts 130, respectively to direct holes of the photocurrent to a particular p-contact 140 of a plurality of p-contacts 140. The pixel 600 may comprise any suitable number of demodulation gates 620, 630, for example four demodulation gates.

The demodulation gates 620 may for example be arranged on the upper surface of the photocurrent collecting structure 110, next to the trunk portion 124 of the photosensitive structure 120. The demodulation gates 620 may be controlled by suitable control circuitry of the time-of-flight sensor. The pixel 600 may for example be a 4-tap pixel.

FIG. 7 shows a plan view onto the photocurrent collecting structure 110 of the pixel 600 from the direction of the photosensitive structure 120, according to a specific example.

In the examples shown so far, the p-doped region 112 and the n-doped region 111 are arranged laterally next to each other. In the example shown in FIG. 7 on the other hand, the p-doped region 112 is laterally surrounded by the n-doped region 111 at the upper surface of the photocurrent collecting structure 110. Deeper below the upper surface of the photocurrent collecting structure 110, the lateral extension of the p-doped region 112 may be greater. According to an example, the arrangement of the n-doped region 111 and p-doped region 112 may be reversed.

The circumference of the trunk portion 124 of the photosensitive structure 120 is indicated with dashed lines in FIG. 7. As shown, both the p-doped region 112 and the n-doped region 111 are in direct contact with the trunk portion 124.

FIG. 8 is a flow chart of a method 800 for fabricating a time-of-flight sensor, in particular at least one pixel of a time-of-flight sensor. The method 800 may for example be used to fabricate the pixels 100, 400 and 600.

The method 800 comprises at 801 an act of providing a Si-based photocurrent collecting structure, at 802 an act of doping the photocurrent collecting structure to provide an n-doped region and a p-doped region, at 803 an act of epitaxially growing a Ge-based photosensitive structure on the photocurrent collecting structure, and at 804 an act of fabricating in the photocurrent collecting structure at least one n-contact and at least one p-contact, wherein the n-doped region is configured to conduct electrons of a photocurrent to the at least one n-contact and wherein the p-doped region is configured to conduct holes of the photocurrent to the at least one p-contact.

According to an example, the method 800 further comprises an act of arranging a p-doped charge sheet at least between the n-doped region and the photosensitive structure, the charge sheet having a different doping concentration than the p-doped region. This charge sheet may be configured to reduce an electric field strength at least in a part of the photosensitive structure.

According to a further example, the method 800 comprises providing a doping gradient in the photosensitive structure and/or the n-doped region and/or the p-doped region.

ASPECTS

In the following, the time-of-flight sensor and the method for fabricating a time-of-flight sensor are further explained using specific aspects.

Aspect 1 is a time-of-flight sensor, comprising: at least one pixel, comprising: a Si-based photocurrent collecting structure, a Ge-based photosensitive structure epitaxially grown on the photocurrent collecting structure, wherein the photocurrent collecting structure comprises an n-doped region and a p-doped region, wherein the n-doped region is configured to conduct electrons of a photocurrent to at least one n-contact and wherein the p-doped region is configured to conduct holes of the photocurrent to at least one p-contact, and wherein the conduction band in the p-doped region comprises a barrier for the electrons of the photocurrent and the valence band in the n-doped region comprises a barrier for the holes of the photocurrent.

Aspect 2 is the time-of-flight sensor of aspect 1, wherein the p-doped region has a doping concentration in the range of $1\times10^{14}$ cm$^{-3}$ to $1\times10^{19}$ cm$^{-3}$.

Aspect 3 is the time-of-flight sensor of aspect 1 or 2, wherein the n-doped region has a doping concentration in the range of $1\times10^{12}$ cm$^{-3}$ to $5\times10^{19}$ cm$^{-3}$.

Aspect 4 is the time-of-flight sensor of one of the preceding aspects, wherein both the n-doped region and the p-doped region have an interface with the photosensitive structure.

Aspect 5 is the time-of-flight sensor of one of aspects 1 to 3, wherein the photocurrent collecting structure further comprises: a p-doped charge sheet arranged at least between the n-doped region and the photosensitive structure, the charge sheet having a different doping concentration than the p-doped region, wherein the charge sheet is configured to reduce an electric field strength at least in a part of the photosensitive structure.

Aspect 6 is the time-of-flight sensor of aspect 5, wherein the charge sheet has a doping concentration in the range of $8\times10^{15}$ cm$^{-3}$ to $2\times10^{16}$ cm$^{-3}$.

Aspect 7 is the time-of-flight sensor of aspect 5 or 6, wherein the charge sheet is also arranged between the p-doped region and the photosensitive structure.

Aspect 8 is the time-of-flight sensor of one of the preceding aspects, further comprising: a transitional region between the photosensitive structure and the photocurrent collecting structure, wherein in the transitional region a concentration of Ge gradually decreases and a concentration of Si gradually increases in a direction from the photosensitive structure towards the photocurrent collecting structure.

Aspect 9 is the time-of-flight sensor of one of the preceding aspects, wherein the photosensitive structure comprises a trunk portion and an upper portion, wherein the trunk portion is arranged within an aperture of a dielectric layer and wherein the trunk portion is coupled to the photocurrent collecting structure, and wherein the upper portion is arranged on top of the trunk portion.

Aspect 10 is the time-of-flight sensor of one of the preceding aspects, wherein the photosensitive structure is n-doped or p-doped, wherein the photosensitive structure comprises a doping gradient, and wherein the doping gradient has a start value at the Si—Ge interface in the range of $3\times10^{13}$ cm$^{-3}$ and $3\times10^{17}$ cm$^{-3}$ and an end value in the range of $5\times10^{17}$ cm$^{-3}$ and $1\times10^{20}$ cm$^{-3}$.

Aspect 11 is the time-of-flight sensor of one of the preceding aspects, wherein the at least one pixel comprises a first and a second n-contact and a first and a second demodulation gate, the first and second demodulation gates configured to direct electrons of the photocurrent to either the first or the second n-contact.

Aspect 12 is the time-of-flight sensor of one of the preceding aspects, wherein the at least one pixel comprises a first and a second p-contact and a third and a fourth demodulation gate, the third and fourth demodulation gates configured to direct holes of the photocurrent to either the first or the second p-contact.

Aspect 13 is a method for fabricating a time-of-flight sensor, the method comprising: providing a Si-based photocurrent collecting structure, doping the photocurrent collecting structure to provide an n-doped region and a p-doped region, epitaxially growing a Ge-based photosensitive structure on the photocurrent collecting structure, and fabricating in the photocurrent collecting structure at least one n-contact and at least one p-contact, wherein the n-doped region is configured to conduct electrons of a photocurrent to the at least one n-contact and wherein the p-doped region is configured to conduct holes of the photocurrent to the at least one p-contact, and wherein the conduction band in the p-doped region comprises a barrier for the holes of the photocurrent and the valence band in the n-doped region comprises a barrier for the electrons of the photocurrent.

Aspect 14 is the method of aspect 13, further comprising: arranging a dielectric material layer on the photocurrent collecting structure, and fabricating an aperture within the dielectric material layer, wherein epitaxially growing the photosensitive structure comprises growing a trunk portion of the photosensitive structure within the aperture and growing an upper portion of the photosensitive structure on top of the trunk portion and the dielectric material layer.

Aspect 15 is the method of aspect 13 or 14, wherein doping the photocurrent collecting structure further comprises: providing a p-doped charge sheet arranged at least between the n-doped region and the photosensitive structure, the charge sheet having a different doping concentration than the p-doped region, wherein the charge sheet is configured to reduce an electric field strength at least in a part of the photosensitive structure.

Aspect 16 is an apparatus comprising means for performing the method according to anyone of aspects 13 to 15.

While the disclosure has been illustrated and described with respect to one or more implementations, alterations and/or modifications may be made to the illustrated aspects without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated aspect implementations of the disclosure.

The invention claimed is:

1. A time-of-flight sensor, comprising:
   a pixel comprising:
      a silicon (Si)-based photocurrent collecting structure; and
      a germanium (Ge)-based photosensitive structure epitaxially grown on the Si-based photocurrent collecting structure,
   wherein the Si-based photocurrent collecting structure comprises an n-doped region and a p-doped region, wherein the n-doped region is configured to conduct electrons of a photocurrent to at least one n-contact and wherein the p-doped region is configured to conduct holes of the photocurrent to at least one p-contact, and
   wherein a conduction band in the p-doped region comprises a first barrier for the electrons of the photocurrent and a valence band in the n-doped region comprises a second barrier for the holes of the photocurrent.

2. The time-of-flight sensor of claim 1,
   wherein the p-doped region has a doping concentration in the range of $1 \times 10^{14}$ cm$^{-3}$ to $1 \times 10^{19}$ cm$^{-3}$.

3. The time-of-flight sensor of claim 1,
   wherein the n-doped region has a doping concentration in the range of $1 \times 10^{12}$ cm$^{-3}$ to $5 \times 10^{19}$ cm$^{-3}$.

4. The time-of-flight sensor of claim 1,
   wherein both the n-doped region and the p-doped region have a respective interface with the Ge-based photosensitive structure.

5. The time-of-flight sensor of claim 1,
   wherein the Si-based photocurrent collecting structure further comprises:
      a p-doped charge sheet arranged at least between the n-doped region and the Ge-based photosensitive structure, wherein the p-doped charge sheet has a different doping concentration than the p-doped region,
         wherein the p-doped charge sheet is configured to reduce an electric field strength at least in a part of the Ge-based photosensitive structure.

6. The time-of-flight sensor of claim 5,
   wherein the p-doped charge sheet has a doping concentration in the range of $8 \times 1015$ cm$^{-3}$ to $2 \times 10^{16}$ cm$^{-3}$.

7. The time-of-flight sensor of claim 5,
   wherein the p-doped charge sheet is also arranged between the p-doped region and the Ge-based photosensitive structure.

8. The time-of-flight sensor of claim 1, further comprising:
   a transitional region between the Ge-based photosensitive structure and the Si-based photocurrent collecting structure, wherein in the transitional region a concentration of germanium that gradually decreases in a direction from the Ge-based photosensitive structure towards the Si-based photocurrent collecting structure and a concentration of silicon that gradually increases in the direction from the Ge-based photosensitive structure towards the Si-based photocurrent collecting structure.

9. The time-of-flight sensor of claim 1,
   wherein the Ge-based photosensitive structure comprises a trunk portion and an upper portion, wherein the trunk portion is arranged within an aperture of a dielectric layer, wherein the trunk portion is coupled to the Si-based photocurrent collecting structure, and wherein the upper portion is arranged on top of the trunk portion.

10. The time-of-flight sensor of claim 1,
   wherein the Ge-based photosensitive structure is n-doped or p-doped, wherein the Ge-based photosensitive structure comprises a doping gradient, and wherein the doping gradient has a start value at a Si—Ge interface in the range of $3 \times 10^{13}$ cm$^{-3}$ and $3 \times 10^{17}$ cm$^{-3}$ and an end value in the range of $5 \times 10^{17}$ cm$^{-3}$ and $1 \times 10^{20}$ cm$^{-3}$.

11. The time-of-flight sensor of claim 1,
   wherein the pixel comprises a first n-contact, a second n-contact, a first demodulation gate, and a second demodulation gate, and wherein the first demodulation gate and the second demodulation gate are configured to direct the electrons of the photocurrent to either the first n-contact or the second n-contact.

12. The time-of-flight sensor of claim 11, wherein the pixel comprises a first p-contact, a second p-contact, a third demodulation gate, and a fourth demodulation gate, wherein the third demodulation gate and fourth demodulation gate are configured to direct the holes of the photocurrent to either the first p-contact or the second p-contact.

13. The time-of-flight sensor of claim 1, wherein the pixel comprises a first p-contact, a second p-contact, a first demodulation gate, and a second demodulation gate, wherein the first demodulation gate and second demodulation gate are configured to direct the holes of the photocurrent to either the first p-contact or the second p-contact.

\* \* \* \* \*